United States Patent
Theodore

(10) Patent No.: US 9,153,644 B2
(45) Date of Patent: Oct. 6, 2015

(54) BACKSCATTERING FOR LOCALIZED ANNEALING

(71) Applicant: Nirmal David Theodore, Mesa, AZ (US)

(72) Inventor: Nirmal David Theodore, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/945,746

(22) Filed: Jul. 18, 2013

(65) Prior Publication Data
US 2015/0021746 A1  Jan. 22, 2015

(51) Int. Cl.
*H01L 29/02* (2006.01)
*H01L 21/22* (2006.01)

(52) U.S. Cl.
CPC ............... *H01L 29/02* (2013.01); *H01L 21/22* (2013.01)

(58) Field of Classification Search
USPC ........................................................ 257/629
See application file for complete search history.

(56) References Cited

U.S. PATENT DOCUMENTS

2005/0029530 A1* 2/2005 Ouchi ............................ 257/79

OTHER PUBLICATIONS http://www.semi1source.com/glossary/default.asp?searchterm=thermal+budget.*
T.L. Alford, D.C. Thompson, J.W. Mayer, N. David Theodore, "Dopant Activation in Ion Implanted Silicon by Microwave Annealing", Journal of Applied Physics, Dec. 1, 2009, vol. 106, 9 pages.

* cited by examiner

*Primary Examiner* — Zandra Smith
*Assistant Examiner* — Lawrence Tynes, Jr.
(74) *Attorney, Agent, or Firm* — Lempia Summerfield Katz LLC

(57) ABSTRACT

A method of fabricating an electronic apparatus includes forming an active layer over a wafer, forming a backscatter layer over the wafer, and directing radiation toward the wafer to anneal the active layer. The backscatter layer is not transparent to the radiation, more reflective than absorptive of the radiation, and positioned such that the backscatter layer inhibits exposure of the wafer to the radiation apart from the active layer.

17 Claims, 6 Drawing Sheets

BACKSCATTERING FOR LOCALIZED ANNEALING

FIELD OF INVENTION

The present embodiments relate to semiconductor devices.

BACKGROUND

Semiconductor wafers are annealed during fabrication for a variety of reasons. For example, wafers are annealed to electrically activate dopant atoms in a semiconductor lattice. The thermal energy applied via the anneal process causes the atoms to diffuse into substitutional positions in the semiconductor lattice. Anneals are also used to change film-to-film or film-to-wafer substrate interfaces, densify deposited films, change states of grown films (e.g., epitaxial regrowth), repair damage from ion implantation, or drive interdiffusion of atoms from one material layer into another material layer.

Furnaces or ovens are often used to apply the thermal energy to the semiconductor wafers. Unfortunately, complications arise during high temperature anneals due to prolonged or uneven high temperature heating. Significant diffusion of dopant and other atoms can occur.

Rapid thermal processing (RTP) methods have been used to minimize undesired diffusion of dopants during heating. Common RTP methods are lamp and laser annealing. Such RTP equipment is used to heat a wafer to high temperatures on a short timescale, e.g., several seconds.

Although both lamp and laser heating can achieve the temperatures needed to repair a disordered silicon lattice and activate dopant atoms, both techniques may create uneven heating. For example, the uneven heating may arise from emissivity differences in near surface device materials. Moreover, photons used in lamp and laser heating cannot penetrate past the near surface region of the semiconductor wafer.

Microwave heating has been presented as a possible alternative to conventional RTP methods. Microwave heating of silicon may allow for more even, volumetric heating of the wafer due to the greater penetration depth associated with microwave radiation. In one approach, a microwave susceptor wafer is used when the target wafer does not absorb microwave energy sufficient for dopant activation or epitaxial regrowth. A microwave susceptor wafer, such as a silicon carbide (SiC) wafer, is exposed to the incident microwave radiation and placed sufficiently near the target wafer for conductive heating. The SiC wafer typically acts as a platform on which the target wafer is placed.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE PRESENTLY PREFERRED EMBODIMENTS

Figure 1:
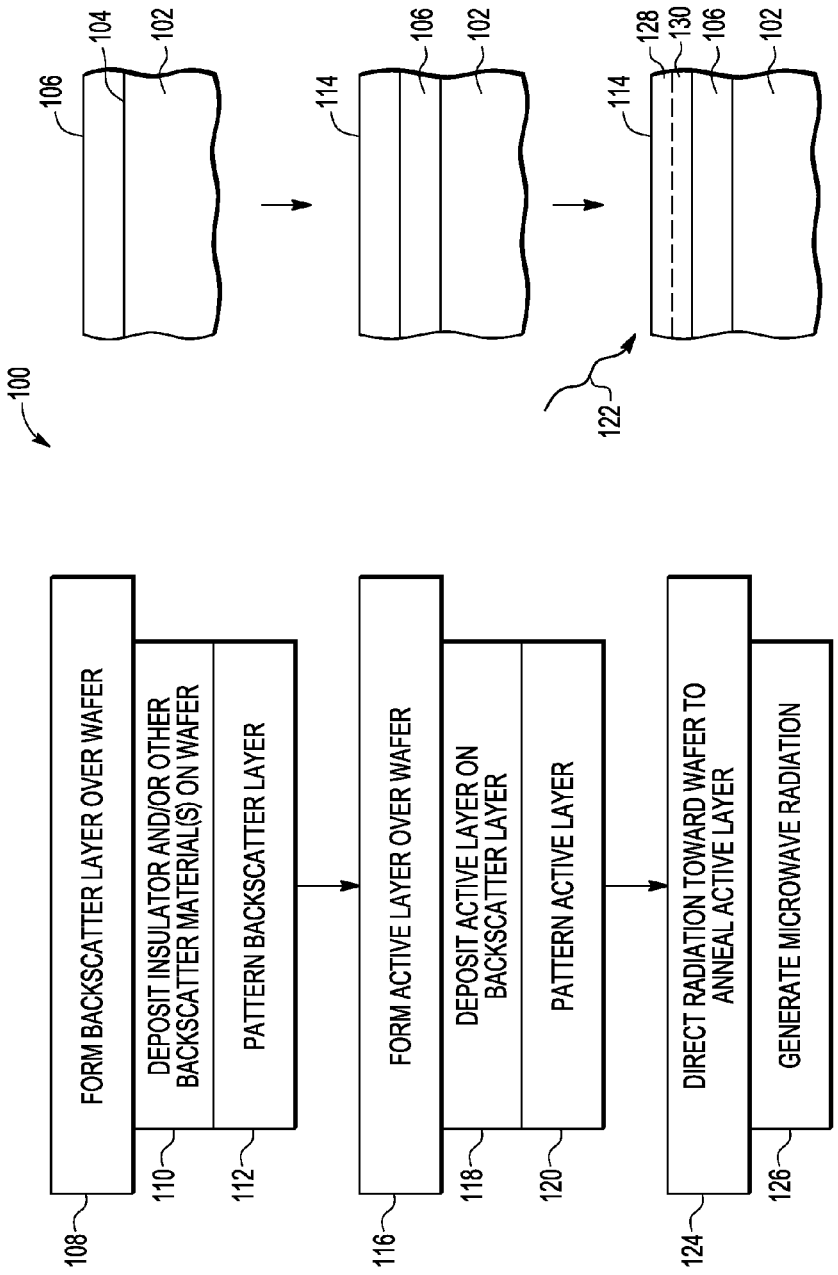
FIG. 1 is a flow diagram of an exemplary method of fabricating an electronic apparatus using a backscatter layer for annealing in accordance with one embodiment, together with several partial, cross-sectional, schematic views of the electronic apparatus at various stages in the fabrication sequence.

Electronic apparatus having one or more backscatter layers for localized, radiation-based annealing, and methods of fabricating such apparatus, are described. Energy for the annealing may be provided by microwave or other radiation. The backscatter layer(s) may provide a subtractive anneal technique in which the radiation is prevented from reaching one or more areas, layers, components, or regions of a wafer. The deleterious effects of undesired heating of other regions may thus be avoided or minimized. The backscatter layer(s) may also be used to increase the exposure of other regions through which the radiation has already passed. The backscatter materials may be sacrificial layers or used in constructing a multiple layer, three-dimensional structure.

The disclosed embodiments may include patterning of the backscatter layer(s) and/or the areas to be annealed to form a variety of different device structures. The backscatter layer(s) may provide micron or nanometer scale heating of unprotected device regions or other active layers. The patterning may be used to irradiate or protect various regions in a particular layer (e.g., spots, lines, stripes, holes, gaps, and other two-dimensional shapes), as well as over multiple layers for annealing of a stacked arrangement built up in accordance with the disclosed methods.

The localized annealing may lead to low temperature fabrication procedures. The localized annealing may be useful in fabricating devices or electronic apparatus with one or more layers, structures, components, or other wafer portions having a low thermal budget. One wafer portion may be annealed while other portions are protected or shielded from the electromagnetic energy and heat. The disclosed embodiments may thus be used to optimize each anneal procedure individually to avoid exceeding the thermal budget of another portion of the wafer. Such separate optimization of the anneal procedures may allow higher or later formed layers to receive higher amounts of energy than any one or more of the lower or previously formed layers. The disclosed embodiments may thus include a lower layer that has a lower thermal budget than an upper layer, a device structure or arrangement not possible with conventional anneal procedures.

Although described below in connection with microwave radiation techniques, the disclosed embodiments are not limited to any particular radiation wavelength or frequency range. Various types of radiation (e.g., ultrahigh frequency (UHF), infrared, visible, ultraviolet, etc.) may be used along the electromagnetic spectrum. The radiation wavelength or frequency may be tailored for absorption by a particular material to be annealed, for backscattering by another material, and/or for transparency through yet another material. Other characteristics of the radiation, such as the intensity, or whether the radiation is continuous or pulsed, may also vary. The disclosed embodiments are well suited for use with non-laser radiation or other non-focused radiation. The disclosed embodiments are configured to achieve localized annealing without having to rely on the precise positioning of a focused laser beam. Instead, localized annealing and other benefits are provided by the backscattering layer(s) of the disclosed embodiments. The radiation may also be incoherent (lack of spatial coherence) or non-collimated. Notwithstanding the foregoing, the disclosed embodiments may use laser or other collimated, coherent, or focused radiation in some cases. For example, a rastering laser may be used to cover multiple areas of a wafer.

Although described below in connection with transparent and absorptive substrates, the disclosed embodiments are not limited to any particular substrate material or wafer type. The disclosed devices and methods may be used with a variety of different compound substrates, including, for example, GaAs, GaN, and SiC substrates. Silicon substrates may also be used. The construction of the substrates of the disclosed devices may also vary. For example, the substrates may be configured as silicon-on-insulator (SOI) substrates. The disclosed embodiments are compatible with a variety of process technologies and/or die technologies. The disclosed embodiments are also not limited to any particular transistor or other device configuration. The transistor and other devices are also not limited to a particular type of charge carrier or conductivity type.

FIG. 1 shows an exemplary fabrication method 100 for fabricating an integrated circuit (IC) or other electronic apparatus. The IC may be fabricated on an IC chip or die formed (e.g., singulated) from a wafer. A substrate 102 of the wafer is shown in the cross-sections of FIG. 1 illustrating the fabrication method. In this embodiment and those described below, the method includes a sequence of acts or steps, only the salient of which are depicted for convenience in illustration. The ordering of the acts may vary in other embodiments. For example, the order in which backscatter and active layers are formed may be reversed in other embodiments, examples of which are described below. Additional, fewer, or alternative steps may be implemented. For example, additional backscatter and active layers may be formed as described below.

The substrate 102 may include a semiconductor substrate. A variety of semiconductor materials may be used, including elementary semiconductors, such as Si, and compound semiconductors, such as GaAs. Other compound and non-compound semiconductor materials may be used. The substrate 102 may be a lightly or heavily doped p-type or n-type substrate. Alternatively or additionally, the substrate 102 includes non-semiconductor materials. For example, the substrate 102 may be configured as a semiconductor-on-insulator (SOI) substrate.

The substrate 102 may be a bulk semiconductor wafer. Other types of semiconductor substrates may be used. In some cases, the substrate 102 is a composite substrate with any number of layers (e.g., epitaxial layers). For example, the substrate may include an original p-type semiconductor substrate on which the insulator, epitaxial, or other layers are grown or otherwise formed. In one example, an n+ buried layer is formed before the growth of the epitaxial layer(s) to achieve a depth that may not be possible or practical via an implantation-based procedure. Alternatively or additionally, such insulator, epitaxial, or other layers are grown or formed at a later stage of the fabrication process in or as one or more active layers supported by the substrate 102. The localized annealing of the disclosed embodiments may be used for dopant activation, lattice repair, or other purposes in connection with such layers.

The structural, material, and other characteristics of the substrate 102 may vary. For instance, the disclosed embodiments are not limited to, for instance, bulk substrates. Additional, fewer, or alternative layers may be included in the substrate 102. For example, the substrate 102 may include a heterostructure configured to establish a heterojunction. Any number of additional semiconductor and/or non-semiconductor layers may be included. The substrate 102 may be supported by or include a wide variety of other types of semiconductor or non-semiconductor substrates. The substrate 102 may correspond with a portion of a semiconductor wafer, which may be diced to form individual die at any time.

The method may begin with, or include, a number of acts in which device structures are formed in the substrate 102. The device structures may be configured to define a number of transistor or other semiconductor devices formed in and/or supported by the substrate 102. The semiconductor devices may be disposed in a circuit arrangement that extends laterally across a surface 104 of the substrate 102. One or more anneal procedures may be implemented in connection with the formation of the device structures. The anneal procedures may be directed to dopant activation, recrystallization, epitaxial regrowth, or any other purpose. The localized annealing of the disclosed embodiments may be used for these purposes. Other techniques may be used, including, for instance, conventional RTP procedures. Alternatively or additionally, the device structures may be formed at a later stage of the fabrication process in one or more active layers supported by the substrate 102. The annealing of such active layers is described below.

The device structures may be formed by doping regions of the substrate 102 via, for instance, an implantation procedure. The regions may correspond with source regions, drain regions, device body regions, and other semiconductor device regions, and are not limited to any particular device type (e.g., FET device). Formation of the device structures need not involve doping the substrate 102. For example, the device structures may include isolation trenches and other structures.

Device structures may also be partially or otherwise formed on or above the surface 104 of the substrate 102. For example, gate structures, silicide blocks, and other structures supported by the substrate 102 may be formed. Although not shown in the cross-sections of FIG. 1, any number of such device structures may be supported by the substrate 102, and arranged in any number of layers, including, for instance, one or more of the layers supported by the substrate 102 that are annealed in accordance with the disclosed embodiments.

A backscatter layer 106 is formed in an act 108 over the wafer. In the example of FIG. 1, the backscatter layer 106 is formed over the substrate 102. The backscatter layer 106 is formed and configured to support localized and/or low temperature annealing, as described below. The anneal procedure is radiation-based, e.g., microwave radiation. With the backscatter layer 106 covering the substrate 102 as shown, the radiation does not reach the substrate 102, thereby preventing or minimizing any further heating or annealing thereof. The backscatter layer 106 may thus be useful in connection with embodiments in which the substrate 102 is absorptive of the radiation.

The formation of the backscatter layer 106 may include depositing in an act 110 one or more materials on the wafer. The materials may be arranged in constituent layers of the backscatter layer 106. For example, the backscatter layer 106 may include one or more thermal insulator layers adjacent the substrate 102. One or more thermally insulating materials may thus be deposited on the substrate 102. The thermal insulation may be useful in the event that a marginal amount of heat is generated or transferred to the backscatter layer 106 during the anneal procedure. In one embodiment, the thermal insulation includes a silicon nitride (e.g., $Si_3N_4$) layer with a thermal conductivity of about 0.5 W/K/m. The thermal insulation may include a thin silicon oxide (e.g., $SiO_2$) layer beneath the silicon nitride layer to buffer any stresses associated with the silicon nitride layer. Further examples of suitable thermal insulator materials include oxides (e.g., $SiO_2$, $Al_2O_3$, ZrO2, ZnO, $SnO_2$, CaO, Yttrium stabilized Zirconia), mixed oxides (e.g., $SrZrO_3$, $BaZrO_3$, $BaMgTaO_3$, LaMoO, GdCaSiO, BaTiO, SrNbO, YbTaZrO, LaYbZrO, (ZrHf)YO, WNbO, BaNdTiO, BaErAlO, GdZrO, LaMgAlTaO, YbSnO, SrZrO), oxynitrides (e.g., SiON, AlON), nitrides ($Si_3N_4$, AlN), carbides (e.g., SiC), silicates (e.g., $Be_2SiO_4$, $Zn_2SiO_4$, $Mg_2SiO_4$, $Fe_2SiO_4$, $ZrSiO_4$, $Al_2SiO_5$), alloys (e.g., AgTlTe), and organic polymers. The thermal insulator material(s) may have a low thermal conductivity and/or a high specific heat capacity.

One or more backscatter materials may then be deposited on the thermal insulator layer and/or the substrate 102. The backscatter material(s) and, more generally, the backscatter layer 106 may be configured to reflect or scatter the incident radiation away from one or more layers or other portions of the wafer, including, for example, the substrate 102. In one embodiment, the backscatter layer 106 includes a layer of Al, Cu, or Ag having a thickness of about 1 µm. Examples of suitable backscatter materials include a variety of different conductive materials, including, for instance, Al, Cu, Au, Ag, and/or other metals, as well as non-metal conductive materials, such as conductive polymers, conductive carbon structures (e.g., carbon nanotubes, graphene sheets, and conductive diamond or diamondoid films), very highly doped semiconductors, doped conductive oxides (e.g., doped ZnO), nanowire or nanorod networks of conductive materials (e.g., metals, alloys, or conductive oxides or carbon), and metal alloys. In some cases, the backscatter layer 106 includes a multiple layer stack of different materials. For example, the stack may be configured as a superlattice structure. Such multiple layer stacks may be optimized to reflect or backscatter a particular wavelength or range of wavelengths.

The backscatter material(s) (and/or the radiation wavelength) may be selected to achieve a desired level or degree of reflectivity. For example, the penetration depth of the radiation may be adjusted to achieve a desired level of reflectivity. Backscatter materials may thus be selected and/or configured based on their magnetic permeability and/or other material properties or characteristics.

The terms "backscatter" and "reflect" and any derivatives thereof are used in a broad sense to include various types of responses to the incident radiation that do not involve transparency or other transmission through an object, or result in non-transient absorption of the electromagnetic energy of the radiation. The backscatter layers described herein are thus not transparent to the radiation, and are more reflective than absorptive of the radiation. For example, the backscatter layers may be substantially more reflective than absorptive such that any absorption of the radiation would not anneal the backscatter layer or, through conduction, any adjacent layers or regions. The terms "backscatter" and "reflect" are not limited to specular or mirror-like reflection. The terms may thus refer to non-specular or diffuse reflection, specular reflection, and any combination thereof. The terms may also include mechanisms in which the energy of the radiation is reemitted after transient or brief absorption.

The formation of the backscatter layer 106 may include patterning of the backscatter layer in an act 112. In the embodiment shown in FIG. 1, the backscatter layer 106 may be configured as a blanket or uniform layer that extends across the full lateral extent of the substrate 102. Such lack of patterning may provide universal protection for the underlying wafer from the incident radiation. Alternatively, the backscatter layer 106 may be patterned to define one or more boundaries. A variety of different layouts may be achieved. Such patterning may allow selective exposure and, thus, selective annealing, to occur. Examples of patterned backscatter layers are provided in connection with the examples shown and described in FIGS. 3, 4, and 6. Other patterns or layouts may be used. The patterning of the backscatter layer 106 in the act 112 may alternatively or additionally include defining one or more structures within the backscatter layer 106.

An active layer 114 is formed over the wafer in an act 116. The active layer may include one or more targets of the anneal procedure. The targets of the anneal procedure and, thus, the composition, configuration, and other characteristics of the active layer 114 may vary considerably. Examples of active layers include ion-implanted and otherwise doped semiconductor layers, one or more constituent layers to be reacted, bonded, or otherwise processed with an adjacent layer of a different material type (which may or may not be part of the active layer 114), and one or more dielectric, passivation, or other layers to be deposited or otherwise layered over the wafer. The active layer 114 may thus include a variety of materials, including, for example, semiconductors, metals, dielectric materials, and various combinations thereof.

The active layer 114 need not be configured as a uniform layer or a stack of uniform layers. The active layer 114 may include any number of structures or other components defined therein. The active layer 114 may thus be internally patterned and/or otherwise configured to define a variety of devices, including, for instance, resistors, capacitors, diodes, transistors, light emitting diodes (LEDs), light emitting transistors (LETs), solar cells, IR sensors, UV sensors, electrochromic devices, liquid crystal display (LCD) devices, and charge coupled devices (CCDs). Such devices and, thus, the active layer 114 may include organic and/or non-organic materials. The configuration of the transistor devices may vary and include, for example, bipolar junction transistor (BJT) devices, field effect transistor (FET) devices, metal-oxide-semiconductor FET (MOSFET) devices, metal-insulator-semiconductor FET (MISFET) devices, junction gate field-effect transistor (JFET) devices, insulated gate bipolar transistor (IGBT) devices, organic field-effect transistors (OFET) devices, metal-semiconductor FET (MESFET) devices, and thin-film transistor (TFT) devices.

The formation of the active layer 114 may include the deposition of one or more active layer materials in an act 118. In this example, the active layer materials are deposited on the backscatter layer 106. The active layer material(s) may be selected to have a frequency response that matches the radiation to be used for heating. The frequency response may be based on one or more polarization phenomena (e.g., dipolar, ionic, and/or electronic). Alternatively or additionally, a frequency may be selected to match the frequency response of one or more active layer materials.

One or more patterning procedures may be implemented in an act 120 directed to patterning the active layer 114. The patterning procedures may be directed to establishing one or more boundaries and, thus, a size and shape, for the active layer 114. Alternatively or additionally, the patterning procedures are directed to defining constituent layers, structures, devices, or other components of the active layer 114.

Radiation 122 is directed toward the substrate 102 of the wafer in an act 124 to anneal the active layer 114. The wavelength (or frequency) of the radiation 122 and/or the material(s) of the active layer 114 may be selected such that the radiation 122 is absorbed by the active layer 114. The absorption leads to heating of the active layer 114 and, accordingly, annealing of the active layer 114. In some embodiments, the radiation 122 includes microwave radiation generated in an act 126. In such cases, the microwave photon energies may fall in a range from about 1.24 $\mu$eV to about 1.24 meV. Alternatively or additionally, other wavelengths or wavelength ranges may be used.

The annealing of the active layer 114 may be directed to various purposes involving the formation of various device structures. As described further below, such purposes and/or device structures may include (i) dopant profiles established via the annealing, (ii) doped regions electrically activated through the annealing, (iii) layers defined or created via the annealing, and (iv) layers bonded by the annealing. In some applications of the embodiment of FIG. 1, the annealing of the active layer 114 is shown to define, establish, or otherwise support the formation of an upper constituent layer 128 and a lower constituent layer 130 of the active layer 114. In one example, the upper and lower constituent layers 128, 130 may be semiconductor regions with different doping levels or different dopants. Alternatively, the upper and lower constituent layers 128, 130 may include different materials, such as a silicide layer disposed on an underlying silicon layer from which the silicide is formed. In another exemplary application, the upper and lower constituent layers 128 and 130 are bonded to one another via the annealing. In yet another application, one or both of the layers 128, 130 includes a dielectric material densified or otherwise processed via the annealing.

The annealing of the active layer 114 is selective or localized. The backscatter layer 106 is configured and positioned (e.g., relative to the active layer 114 and the radiation 122) such that the backscatter layer 106 inhibits exposure of the wafer to the radiation apart from the active layer 114. For instance, exposure of other wafer regions or layers apart from the active layer 114 is inhibited. In the example of FIG. 1, the backscatter layer 106 is disposed between the active layer 114 and the substrate 102 of the wafer to limit the absorption of the radiation 122 to the active layer 114 and thereby protect the substrate 102. Such positioning of the backscatter layer 106 is established via deposition or other formation of the backscatter layer 106 before forming the active layer 114 and any components thereof.

The wavelength of the radiation 122 and/or the material(s) of the backscatter layer 106 may also be selected to optimize the reflection or backscattering of the radiation 122 by the backscatter later 106. For example, the backscatter layer 106 may be configured to absorb very little, if any, of the radiation 122. The active layer 114 may include one or more materials absorptive of electromagnetic energy at a predetermined wavelength (or wavelength range) at which the backscatter layer 106 backscatters the electromagnetic energy.

The positioning of the active layer 114 above the backscatter layer 106 leads to additional exposure of the active layer 114. Any electromagnetic energy that reaches the backscatter layer 106 is reflected or otherwise backscattered and, thus, passes through the active layer 114 a second time. The active layer 114 may thus be exposed twice. The configuration shown in FIG. 1 may thus be useful in connection with materials in the active layer 114 that are weak or low absorbers of the radiation 122. However, the active layer 114 may alternatively or additionally include materials that are strong or medium absorbers of the radiation 122.

The method 100 fabricates a device or electrical apparatus in which regions, layers, or other portions of the wafer are exposed to different amounts of energy. Different thermal budgets may thus be accommodated. A subsequently formed layer may have a higher thermal budget than a previously formed layer or substrate. In the embodiment of FIG. 1, even though the method 100 involves an arrangement in which the active layer 114 is disposed over the backscatter layer 106 and, thus, formed on the substrate 102, the active layer 114 may have an annealed configuration attained in accordance with or via a thermal budget higher than the thermal budget of the substrate 102. In conventional anneal processes, a substrate with a lower thermal budget would not be feasible, as the substrate would be exposed to the same (or nearly the same) amount of energy as the subsequently formed layers, such as the active layer 114. The positioning of the backscatter layer 106 allows the active layer 114 to have a higher thermal budget than the substrate 102.

The term "thermal budget" refers to the total amount of thermal energy that may be transferred to a wafer or portion thereof (e.g., a specific layer, structure, or other component) during elevated temperature operations or procedures without causing damage or other undesirable results. In some cases, the thermal budget of a specific portion of a wafer may be established during the design process as a maximum permitted thermal energy level for the specific portion. A wide variety of factors or parameters may be considered in establishing the thermal budget for a specific wafer portion, including, for example, various diffusion-related considerations.

In the embodiment of FIG. 1, neither the backscatter layer 106 nor the active layer 114 is patterned to define boundaries thereof to, for instance, selectively anneal a portion of the active layer 114. The method 100 results in heating across the two-dimensional area presented by the active layer 114. The method 100 may thus be considered a blanket anneal across the wafer. As described herein, one or both of the backscatter layer 106 and the active layer 114 may be patterned to localize the anneal within one or more areas of the active layer 114. For example, the patterning may define an annealed area or region in the shape of one or more stripes or lines (quasi-one-dimensional areas) or one or more spots (quasi-zero dimensional areas), or the inverses thereof (e.g., an active area having a line-shaped or spot-shaped gap or hole). Such patterning relates to the definition of the boundaries of the backscatter layer 106 and/or the active layer 114, rather than any internal patterning of the active layer 114 to form, for instance, devices or device components therein. For example, the active layer 114 may include a number of device regions, such as source/drain regions, shallow trench isolation (STI) regions, and interconnects, defined and formed therein.

Additional steps or acts may be implemented at various points during the fabrication procedure. For example, any number of steps or processes may be implemented to define various structures within the active layer 114, the substrate 102, and/or other layer or component of the wafer. Any number of additional backscatter layers 106 and active layers 114 may be formed to produce a stack, examples of which are described below. Such stacks may involve patterning into the quasi-one-dimensional or zero-dimensional shapes referenced above. The steps or acts may be implemented in various orders. For example, the backscatter layer 106 may be formed after the formation of the active layer 114 over the substrate 102, as described below.

The term "over" is used in a broad sense to include arrangements in which an item or object is disposed above or below another item or object depending on the orientation of the wafer. Formation of a layer over a wafer includes forming the layer across the wafer. Thus a layer disposed over a substrate may cover the substrate, regardless of whether the substrate is flipped or otherwise reoriented. The term "over" may refer to positions both adjacent and not adjacent a layer or other structure.

The electronic apparatus of FIG. 1 is shown in simplified form. The figures do not show the device structures and all of the metal, passivation, and/or other layers supported by the substrate 102. For example, FIG. 1 may not show a number of the regions of the substrate 102 or active layer 114 configured to form one or more transistor or other devices. The electronic apparatus may have a number of other structures or components for connectivity, isolation, packaging, and other purposes not shown in FIG. 1 for ease in illustration. For instance, the electronic apparatus may include an enclosure, lead frame, or other packaging element coupled to the substrate 102 and/or other components of the electronic apparatus.

Figure 2:
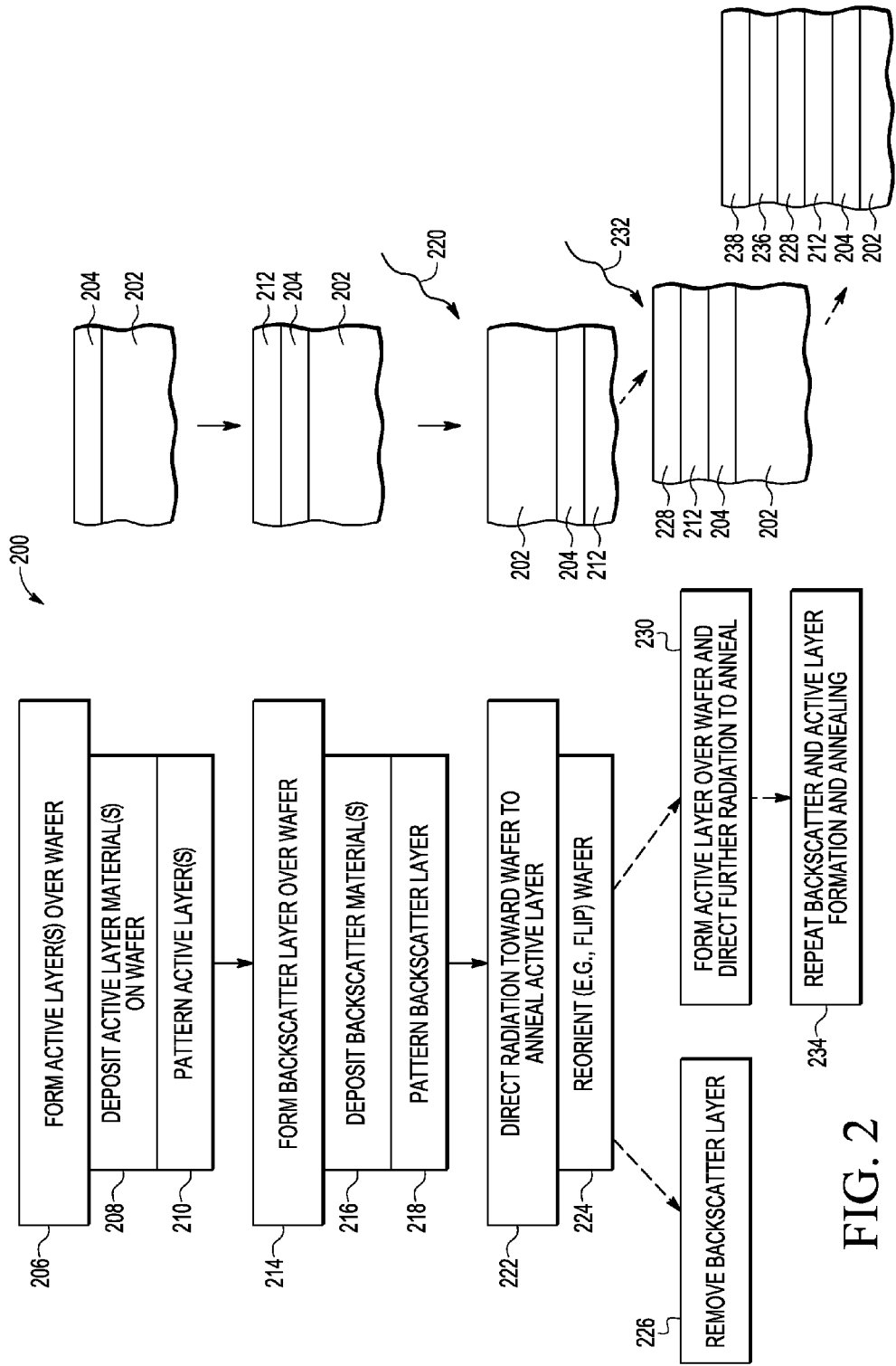
FIG. 2 is a flow diagram of another exemplary method of fabricating an electronic apparatus using a backscatter layer for annealing in accordance with one embodiment, together with several partial, cross-sectional, schematic views of the electronic apparatus at various stages in the fabrication sequence.

FIG. 2 depicts another method 200 of fabricating an electronic apparatus in which backscattering is used to localize radiation-based annealing. The method may be similar to several of the embodiments described above, with the exception of the relative positioning of the backscatter and active layers. The example of FIG. 2 also differs in that the electronic apparatus includes a transparent substrate 202. The transparent substrate 202 is transparent at a wavelength (or in a wavelength range) of the radiation used in the anneal process.

The transparent substrate 202 may have a bulk, composite, or other substrate configuration. A number of different materials may be used. In embodiments in which microwave radiation is used, the transparent substrate 202 may include substrates and/or layers of intrinsic or high-resistivity semiconductors (e.g., undoped or low-doped Si and Ge), intrinsic or low-doped Group III-V compound semiconductors (e.g., GaAs, AlP, AlAs, AlSb, GaP, GaSb, InP, InAs, InSb, AlGaAs, InGaAs, AlGaP, AlGaSb, InGaP, InGaAs, InGaSb), intrinsic or low-doped Group II-VI compound semiconductors (e.g., ZnSe, ZnS, ZnTe, CdS, CdSe, CdTe, HgS, HgSe, HgTe, ZnCdS, ZnCdSe, ZnCdTe, HgCdS, HgCdSe, HgCdTe), insulating or high-resistivity oxides (e.g., $SiO_2$, $Al_2O_3$, $B_2O_3$, $P_2O_5$, GaO, $Ge_2O_3$, $As_2O_3$, $In_2O_3$, $SnO_2$, $Sb_2O_3$, BiO, $BBiO$, ZnO, CdO, CuO, NiO, $Fe_2O_3$, MnO, MoO, $Cr_2O_3$, VO, $TiO_2$, $Nb_2O_5$, $Mo_2O_3$, TaO, WO, MgO, CaO, SrO, BaO, YO, $ZrO_2$), insulating or high-resistivity silicates (e.g., $Be_2SiO_4$, $Zn_2SiO_4$, $Mg_2SiO_4$, $Fe_2SiO_4$, $ZrSiO_4$, $Al_2SiO_5$), and insulating or high-resistivity nitrides (e.g., $Si_3N_4$, AlN, CN, BN, GaN, GeN, InN, SnN, ZnN, CdN, CuN, CrN, VN, TiN, YN, ZrN, YbN, TaN, WN). The materials may vary based on the wavelength(s) of the radiation. In ultraviolet examples (e.g., photon energies in a range from about 3.2 eV to about 124 eV), materials with bandgaps greater than the ultraviolet photon energy (e.g., shallow ultraviolet) may be used, such as BN, AlN, diamond carbon, $LiNbO_3$, $SnO_2$, ZnS, $B_{12}As_2$, GaN, AlGaN, CuCl, ZnO, SiC, $SrTiO_3$. In visible light examples (e.g., photon energies in a range from about 1.7 eV to about 3.2 eV), materials with bandgaps greater than the specific visible light photon energy (e.g., 3.2 eV) may be used (e.g., wide bandgap materials), such as $TiO_2$, SiC, $BaTiO_3$, ZnSe, Sg, AlP, CdS, SiC, GaP, AlGaP, ZnTe, $SnS_2$, $Cu_2$), AlAs, GaSe, BP, $La_2CuO_4$, InGaN, Se, CdSe, BN, AlN, diamond carbon, $LiNbO_3$, $SnO_2$, ZnS, $B_{12}As_2$, GaN, AlGaN, CuCl, ZnO, SiC, and $SrTiO_3$. In infrared examples (e.g., photon energies in a range from about 1.24 eV to about 1.7 eV), materials with bandgaps greater than the specific infrared photon energy (e.g., 1.7 eV) may be used, such as AlSb, BaS, CdTe, $S_4$, GaAs, GaAsP, AlGaAs, CdZnTe, InP, InGaP, $Cu_2S$, CuO, Si, SnS, $CuInSe_2$, Se, $FeS_2$, $Ag_2S$, GaSb, InN, GaAsSb, Ge, SiGe, PbS, InAs, InGaAs, AlInAs, Te, PbTe, PbSe, InSb, and $Cd_3As_2$. In X-ray examples (e.g., photon energies in a range from about 124 eV to about 1.24 keV), materials with very low X-ray absorption may be used, such as low-atomic number elements (e.g., Li, Be, B, C, N, O, F) and their compounds, and other elements (e.g., Na, Mg, Al, Si, P, S, Cl) and their compounds.

The method may begin with the formation of an active layer 204 over the wafer in an act 206. In this example, the formation of the active layer 204 includes depositing one or more active layer materials in an act 208. The material(s) are absorptive at the wavelength(s) of the radiation (i.e., the wavelength(s) at which the substrate 202 is transparent). The active layer materials may vary as described above. In examples having an intrinsic or undoped silicon substrate, the active layer materials may include moderately to highly doped silicon (e.g., with dopant atoms such as B, P, As, Sb, Al, or Ga), implanted silicon with a Ti-silicide layer on top, implanted silicon with a Co-silicide layer on top, doped polycrystalline-silicon with or without Ti-silicide on top, or doped polycrystalline-silicon with or without Co-silicide on top. In examples having an intrinsic or undoped GaAs substrate, the active layer materials may include moderately to highly doped GaAs (e.g., with dopant atoms such as S, Se, Te, Si, Ge, Mg, Zn, or Cd). The active layer 204 may then be patterned in an act 210. Such patterning may be directed to defining one or more boundaries of the active layer 204.

A backscatter layer 212 is then formed over the wafer in an act 214. In this embodiment, the active layer 204 is formed before the backscatter layer 212 such that the active layer 204 is disposed between the backscatter layer 212 and the substrate 202. The backscatter layer 212 may be formed on the active layer 204. The backscatter layer 212 and the active layer 204 may be adjacent to one another, as in the above-described embodiments, but with the active layer 204 buried by the backscatter layer 212 instead.

One or more backscatter materials may be deposited in an act 216. The backscatter material(s) are configured to reflect or otherwise backscatter radiation at the wavelength(s) at which the substrate 202 is transparent and the active layer 204 is absorptive. Various backscatter materials may be used, including those materials referenced above. For example, in embodiments having an intrinsic or undoped silicon substrate, the backscatter materials may include Al, Cu, or Ag. In one embodiment, an Ag layer having a thickness of about 1 µm is used as the backscatter layer 212. The backscatter layer 212 may then be patterned in an act 218. Such patterning may be directed to defining one or more boundaries of the backscatter layer 212.

Radiation 220 is directed toward the wafer to anneal the active layer 204 in an act 222. The application of the radiation may include flipping or reorienting the wafer in an act 224. As shown in FIG. 2, the reorientation may result in the substrate 202 being disposed above the active layer 204. With the substrate 202 transparent to the radiation 220, the radiation 220 passes through the substrate 202 to reach the active layer 204. If the radiation 220 is not fully absorbed by the active layer 204, then the backscattering provided by the backscatter layer 212 exposes the active layer 204 to the radiation a second time. The backscatter layer 212 is also configured and positioned in this embodiment such that the backscatter layer 212 minimizes exposure to the radiation 220 beyond the active layer 204. For example, any layers or materials deposited or present on the other side of the backscatter layer 212 are not exposed to the radiation 220.

In some cases, the backscatter layer 212 is removed in an act 226 following the irradiation or exposure of the active layer 204. The backscatter layer 212 may be partially removed or completely removed. For example, the backscatter layer 212 may be patterned and/or thinned. Alternatively, the backscatter layer 212 may be completely removed.

An additional active layer 228 may be formed over the wafer in an act 230. Any one or more active layer materials may be deposited on the backscatter layer 212, including, for instance, one or more of the active layer materials referenced above. In such cases, the active layer 204 is configured as an intermediate active layer disposed between the active layer 228 and the substrate 202. When further radiation 232 is directed toward the wafer, the backscatter layer 212 minimizes an extent to which the radiation 232 reaches the intermediate active layer 204. The radiation 232 is instead absorbed only by the active layer 228. The backscatter 212 protects the active layer 204 from further exposure and, thus, further heating. The backscatter layer 212 may thus be used to tailor the annealing of the active layer 204 and the active layer 228. The active layers 204, 228 may thus have different thermal budgets. For example, the active layer 204 may have a lower thermal budget than the active layer 228.

The further radiation 232 need not have the same wavelength(s) as the radiation 220. For example, a different wavelength may be used because the radiation 232 does not pass through the substrate 202. The radiation 220 may have a different wavelength than the radiation 232 for additional or alternative reasons, such as for optimizing the absorption and/or backscattering thereof.

In some embodiments, the formation and irradiation of backscatter and active layers is repeated in an act 234. Backscatter material of a further backscatter layer 236 is deposited on the active layer 228, and active layer material of yet another active layer 238 is disposed on the further backscatter layer 236. Still further radiation may then be directed toward the wafer to anneal the active layer 238, with the backscatter layer 236 minimizing an extent to which the further radiation reaches any of the other active layers.

The device structures shown in FIG. 2 with an intermediate active layer (e.g., the active layer 204) may be fabricated in a method in which the active layer 204 is not irradiated as described above. In such cases, the substrate 202 need not be transparent, as the radiation 220 is not used to anneal the active layer 204. Instead, the active layer 204 is protected from radiation-based heating by the backscatter layer 212 and, in some cases, the backscatter layer 236.

The electronic apparatus, device structures, and fabrication methods described above in connection with FIGS. 1 and 2 (and elsewhere herein) may be used in connection with doping procedures, such as (i) recrystallization and/or electrical activation of ion-implanted Si layers, (ii) recrystallization and/or electrical activation of arsenic, boron, phosphorus, antimony, or BF2 implanted Si layers and other layers (e.g., SiGe, SiGeC layers), (iii) ion implantation for device fabrication involving Group III-V compounds (e.g., GaAs, AlGaAs, AlAs, InAs, InGaAs, InGaP, InP, other III-V compounds), (iv) Si ion implantation to create high quality channels, (v) O and H ion implantation to produce device isolation, (vi) MeV Si and O ion implantation to form internal links, (vii) annealing processes to electrically activate dopants, and/or to heal crystal defects from the implants, (viii) ion implantation for device fabrication involving GaN and other GaN compounds (e.g., AlGaN, InGaN), including, for instance, Si, Mg, C ion implantation for doping, as well as Ti, O, Fe, and Cr implantation for high-resistivity GaN, (ix) ion implantation for II-VI compound devices (e.g., ZnSe, ZnS, CdTe, HgCgTe, and CdS devices with Co, B, or other implants), and (x) ion implantation for oxide-based dielectrics and semiconductor device applications (e.g., ZnO, Tin-oxide, Indium-Tin-oxide, as well as N-, O-, Fe-, Zn-, Y-, Ag-, Co-, H-, and Ga-implanted ZnO).

The embodiments may also be used in connection with electrical activation procedures in addition to the ion-implanted cases listed above, including, for instance, procedures directed to dopants that (a) are incorporated by a non-ion-implantation procedure, such as diffusion from a source layer, (b) are disposed in a deposited layer but not yet electrically activated, or (c) constitute a previously incorporated dopant that was de-activated by another process and to be re-activated again. Examples of such dopants include (i) arsenic, boron, phosphorus, or antimony doped Si to be electrically activated, (ii) doping and activation for Group III-V or II-VI or GaN-based, or oxide-based devices (and/or others using a process other than ion-implantation), doping and activation for organic conductors or semiconductors, and doping for oxide-based dielectrics and semiconductor device applications (e.g., ZnO, Tin-oxide, Indium-Tin-oxide, as well as N-, O-, Fe-, Zn-, Y-, Ag-, Co-, H-, and Ga-doped ZnO).

The embodiments may also be used in connection with thermal diffusion procedures to drive in the dopants (such as any of the dopants referenced above) deeper into a layer or substrate. The thermal diffusion may be directed to achieving a desired doping profile for specific device applications (e.g., a diode, transistor, or other device).

The embodiments may also be used in connection with layering procedures, such as the formation of the following types of layers: (i) reaction layers involving, for instance, reaction between two or more layers (e.g., silicidation and/or other reaction of a metal with GaAs or InP or GaN for contacts or other metal-semiconductor field-effect-transistor applications); (ii) silicidation (e.g., Ti, Co, W, Pt, and/or Ni layer(s) on Si to be reacted with Si to form a silicide conducting layer); (iii) germanide formation (e.g., Ti, Co, W, Pt, and/or Ni layer(s) on Ge to be reacted with Ge to form a germanide conducting layer); (iv) crystallization (e.g., amorphous-Si conversion to nano-crystal Si or poly-Si); (v) solid-phase epitaxy (e.g., amorphous-Si conversion to crystalline Si based on epitaxy with underlying Si); (vi) ion-cut exfoliation (e.g., use of a hydrogen implant into a substrate followed by a thermal-shock anneal, such as a microwave anneal, to cleave off the top layers, in which the top layers are thermally shocked but not the rest of the substrate); (vii) bonding of two different materials (e.g., p-type Si to n-type Si, highly doped Si to low-doped Si, metal underlayer to Si overlayer, GaAs to Si, GaN to Si, and Si to SiO2); and (viii) deposition of overlayer films by chemical vapor deposition (CVD), atmospheric pressure CVD, high-pressure CVD, low-pressure CVD, photochemical UV low-pressure CVD, or plasma-enhanced CVD, including, for instance, CVD of SiO2, Si3N4, epitaxial-Si, poly-Si, and metals such as Al, Al—Si, Al—Cu, Ni—Cr, Au, W, Ti, Mo, Pt, Pd, Co, Ni, and related silicides.

The disclosed embodiments having a buried backscatter layer may also be used in connection with oxidation, nitridation, and other deposition procedures. For example, the method and device structure shown in FIG. 1 may be used to densify oxide, nitride, and other deposited layers. The active layer 228 of the embodiment shown in FIG. 2 may also be used to support such procedures.

The disclosed embodiments may also be used for locally enhanced heat treatment procedures for various purposes, such as: (i) conversion of amorphous-material (a-Si) to nano-crystalline material (nc-Si); (ii) conversion of amorphous-material (a-Si) to poly-crystalline material (poly-Si); (iii) conversion of amorphous-material (a-Si) to single-crystalline material, e.g., lateral-epitaxial Si; (iv) vertical solid-phase epitaxy; (v) grain growth (e.g., increasing the grain size of a metal layer such as Al, or Au, or increasing grain size of poly-Si); (vi) defect removal (e.g., vacancies, interstitials, dislocations, stacking faults); (vii) electrical activation of dopants; (viii) driving in dopant atoms to create a desired dopant profile (e.g., to tailor electrical properties of a device); (ix) reaction of two layers to form a compound (e.g., silicidation); and (x) densification of layers (e.g., densification of deposited low-density oxides or nitrides).

The embodiments having a buried backscatter layer (see, e.g., FIG. 1 and the embodiment having the active layer 228 of FIG. 2) may also be used in connection with patterning procedures, such as locally enhanced patterning (e.g., selective removal of top layers of a material where the removal is enhanced by local heat or microwaves) and etching (e.g., wet etching, dry etching, lift-off procedures, ion milling, and reactive ion etching).

Figure 3:
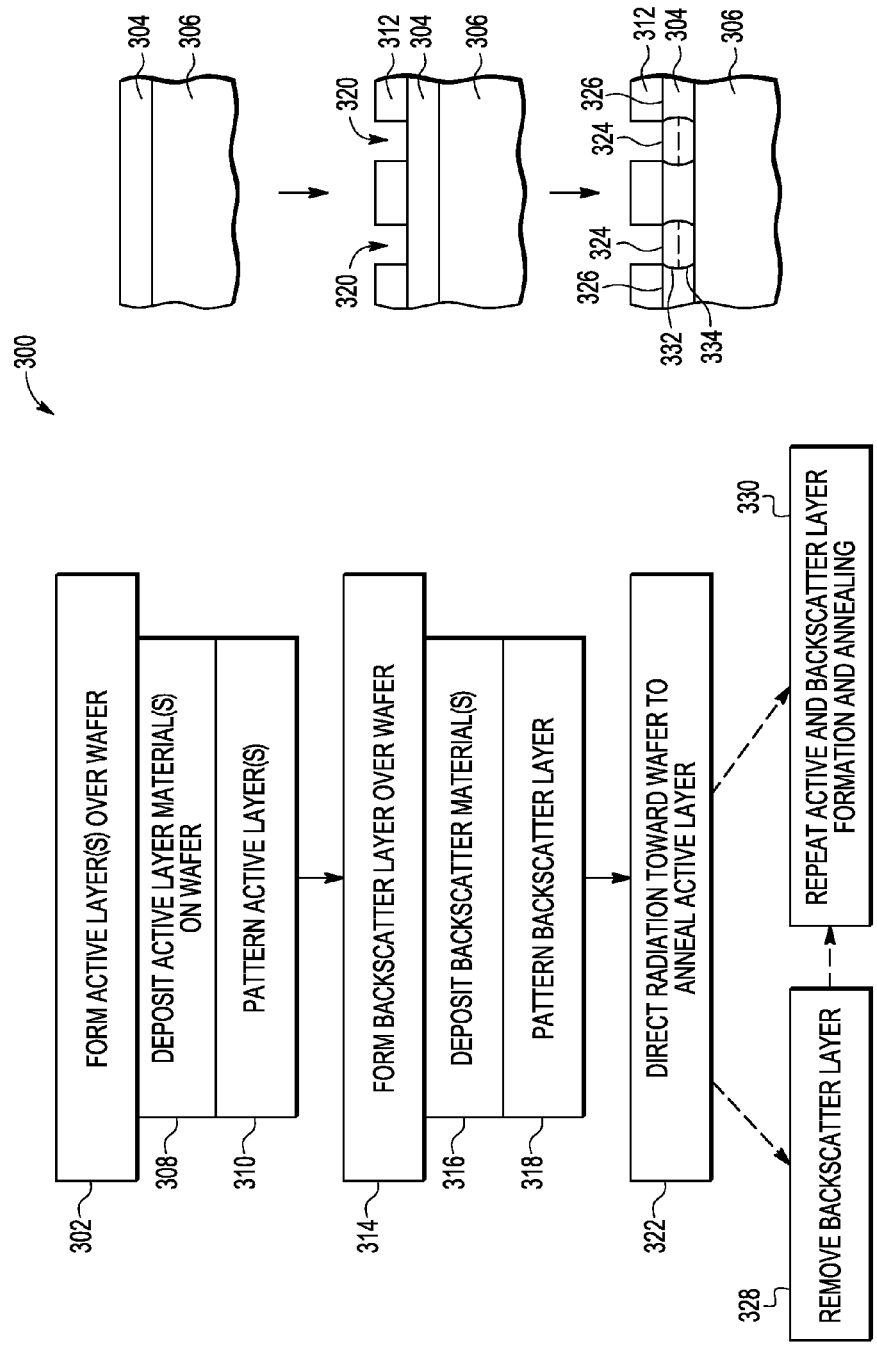
FIG. 3 is a flow diagram of an exemplary method of fabricating an electronic apparatus using a patterned backscatter layer for annealing in accordance with one embodiment, together with several partial, cross-sectional, schematic views of the electronic apparatus at various stages in the fabrication sequence.

FIG. 3 depicts a fabrication method 300 in which backscatter layer patterning is used to define annealed and non-annealed active layer sections of an electronic apparatus. The method may begin with the formation in an act 302 of one or more active layers 304 over a substrate 306 of a wafer. In this embodiment, the act 302 includes depositing in an act 308 one or more active layer materials on the substrate 306. The act 302 may further include patterning in an act 310 of the active layer 304. The patterning may be directed to defining a boundary of the active layer 304 and/or to defining one or more constituent structures of the active layer 304.

A backscatter layer 312 may then be formed over the wafer in an act 314. The formation of the backscatter layer 312 includes depositing one or more backscatter materials on the active layer in an act 316 and patterning the backscatter layer 312 in an act 318. In the example of FIG. 3, the patterning defines a pair of gaps 320 in the backscatter layer 312. One or both of the gaps may be stripe- or line-shaped or spot-shaped. The gaps may have other shapes or sizes. The gaps reveal corresponding portions of the active layer 304.

The patterning of the backscatter layer 312 may be implemented through an etch procedure, a liftoff procedure, or other procedure. For example, the backscatter layer 312 may include one or more metal layers, the gaps 320 in which are formed through a liftoff procedure. In another example, the backscatter layer 312 includes one or more thermally insulating layers underneath one or more metal layers, the gaps 320 in which are formed through deposit, pattern and etch procedures. In yet another example, the backscatter layer 312 includes one or more non-metal conducting layers, the gaps 320 in which are formed through a deposit and etch procedure. In one embodiment, the backscatter layer 312 includes one or more layers of Al (or Cu or Ag), the gaps 320 in which are formed through a deposit, pattern and etch procedure.

In an act 322, radiation is directed toward the wafer to anneal the active layer 304. As with the above-described embodiments, the backscatter layer 312 is configured and positioned such that the backscatter layer 312 minimizes exposure to the radiation beyond the active layer 304. In this embodiment, the patterning of the backscatter layer 312 defines sections or regions 324 of the active layer 304 exposed to the radiation and sections or regions 326 of the active layer 304 not exposed to the radiation. The sections 324 are disposed in the gaps 320, and the sections 326 are disposed under and, thus covered or protected by, the backscatter layer 312. The sections 324 absorb the radiation and are annealed, while the sections 326 are not heated and, thus, not annealed.

The resulting electronic apparatus includes the substrate 306, the backscatter layer 312 supported by the substrate 306, and the active layer 304 disposed adjacent the backscatter layer 312. The active layer 304 includes one or more of the annealed sections 324 and one or more of the non-annealed section 326. The annealed and non-annealed sections 324, 326 have a layout defined by, or that otherwise corresponds with, a pattern of the backscatter layer 312. In this embodiment, the active layer 304 is disposed between the backscatter layer 312 and the substrate 306 such that the non-annealed section 326 is covered by the backscatter layer 312.

In some embodiments, the method 300 may include the removal of the patterned backscatter layer 312 in an act 328. Alternatively or additionally, the method 300 includes further active and backscatter layer formation and annealing of the further active layer in an act 330. Further radiation may then be directed to the wafer to anneal the further active layer. In cases in which the backscatter layer 312 is removed, the act 330 may include the deposition of further backscatter material(s) on the active layer 304, and the deposition of further active layer material(s) on the further backscatter material(s). In cases in which the backscatter layer 312 is not removed, the act 330 may reverse the order in which the layers are deposited (i.e., active material first, followed by backscatter material). The further backscatter material may then be patterned to expose the further active layer as described above. In either case, the active layer 304 may thus constitute an intermediate active layer of the electronic apparatus.

The annealed sections 324 of the active layer 304 may be or include various device structures. As described herein, such device structures may include or involve (i) dopant profiles established via the annealing, (ii) dopants electrically activated through the annealing, (iii) layers defined or created via the annealing, and (iv) layers bonded by the annealing. In one exemplary application of the embodiment of FIG. 3, one or both of the annealed sections 324 include an upper constituent layer 332 and a lower constituent layer 334. The upper and lower constituent layers 332, 334 may include different materials, such as a silicide layer disposed on an underlying silicon layer from which the silicide is formed. In another exemplary application, the upper and lower constituent layers 332, 334 are bonded to one another via the annealing. In yet another application, one or both of the layers 332, 334 includes a dielectric material densified or otherwise processed via the annealing.

The embodiments of FIG. 3 may be applied as described above in connection with the embodiments of FIGS. 1 and 2. For example, the resulting line- or spot-shaped structure(s) shown in FIG. 3 may be useful in connection with ion implantation procedures, electrical activation, thermal diffusion, layer formation (e.g., silicidation, epitaxy, bonding, densification, and deposition), enhanced patterning or etching, and other heat treatment procedures for various purposes, including crystallization, grain growth and defect removal.

Figure 4:
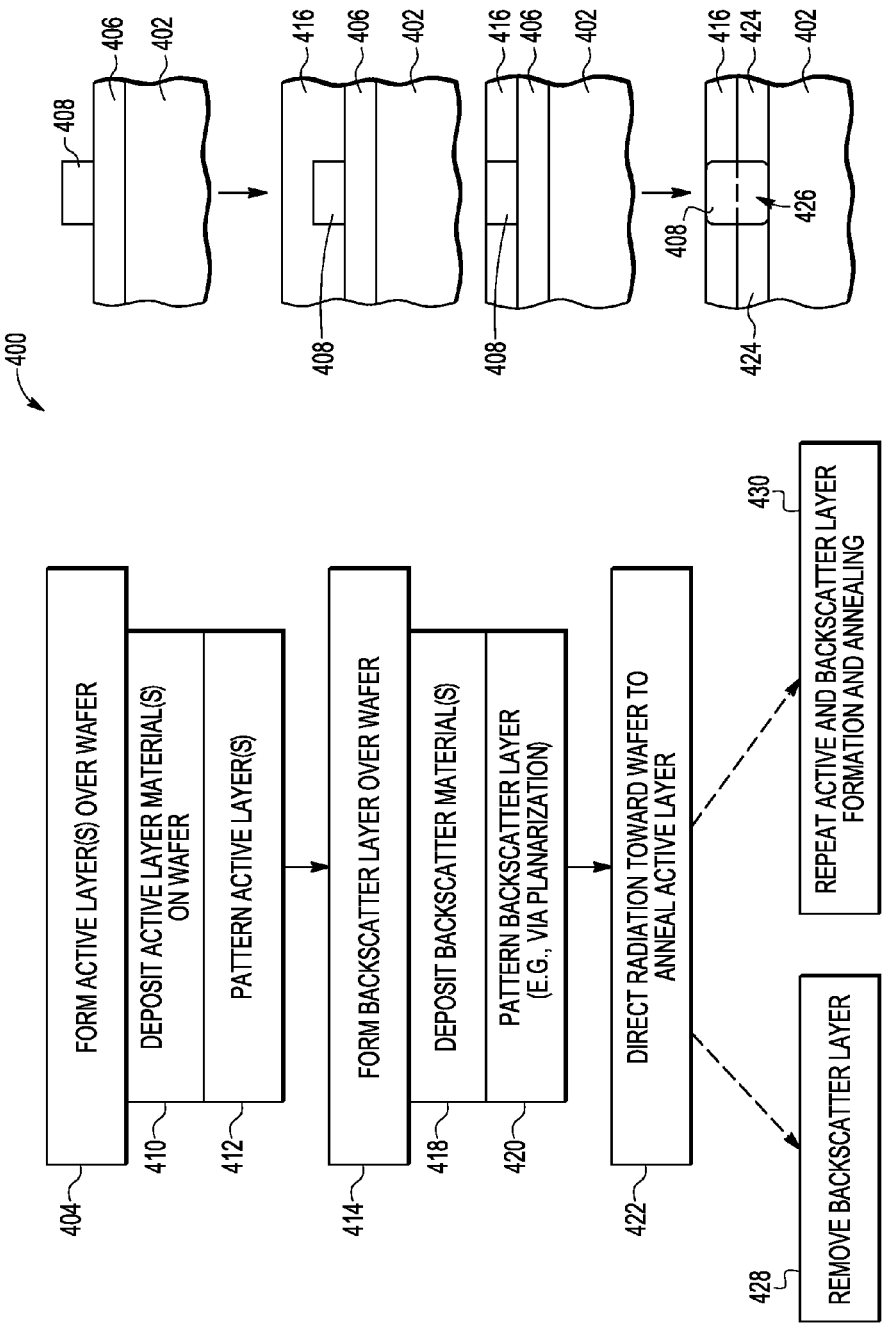
FIG. 4 is a flow diagram of another exemplary method of fabricating an electronic apparatus using a patterned backscatter layer for annealing in accordance with one embodiment, together with several partial, cross-sectional, schematic views of the electronic apparatus at various stages in the fabrication sequence.

FIG. 4 depicts a fabrication method 400 in which patterning of active and backscatter layers is implemented to define annealed and non-annealed sections arranged in a heterostructure or other multi-level or multi-layer structure on a wafer. The method may begin with multiple active layers formed over a substrate 402 of the wafer in an act 404. In this example, a lower active layer 406 is formed on the substrate 402, and an upper active layer 408 is formed on the lower active layer 406. One or more active layer materials may be deposited in an act 410 to form the lower and upper active layers 406, 408. In this embodiment, the upper active layer 408 is then patterned in an act 412 as shown in the cross-section. The patterned upper active layer 408 may include a stripe-, line-, spot-, or other shaped structure. The patterned upper active layer 408 may include any number of such structures of similar or differing configuration.

In an act 414, a backscatter layer 416 is formed over the wafer. In this embodiment, one or more backscatter materials are deposited in an act 418 over and around both of the active layers 406, 408. For example, the backscatter materials may be deposited on both of the active layers 406, 408. The backscatter layer 416 may have a thickness sufficient to laterally extend across and cover the active layers 406, 408. In some cases, the backscatter layer 416 may have a conformal shape rather than the non-conformal shape shown in FIG. 4. In either case, the formation of the backscatter layer 416 includes a patterning procedure in an act 420. The patterning procedure may be or include a mechanical, chemical etch, chemical-mechanical, or other wafer planarization or removal. The procedure may be configured to thin the backscatter layer 416 to an extent sufficient to reveal the patterned active layer 408. In some cases, the active layer 408 may be thinned as well. Once patterned, the backscatter layer 416 may include multiple sections that laterally surround, or are otherwise laterally adjacent to, the active layer 408.

When radiation is directed to the wafer in an act 422, the active layers 406, 408 are annealed or not annealed based on the coverage of the remaining sections of the backscatter layer 416. In this example, the planarization of the wafer exposes the patterned active layer 408 to the radiation. The patterned active layer 408 is thus annealed. In contrast, sections 424 of the active layer 406 remain covered by the backscatter layer 416 and, thus, are not annealed. In this example, a section 426 of the active layer 406 directly under the patterned active layer 408 is also annealed. Such annealing of the lower active layer 406 may occur if, for instance, the material(s) of the active layer 408 are weak absorbers of the radiation. The material(s) of the active layer 406 may be weak, medium, or strong absorbers of the radiation. The radiation wavelength, material compositions, thicknesses, and other characteristics of the active layers 406, 408 may be selected or configured to attain a desired level of annealing in each layer 406, 408.

The resulting structure includes the annealed active region 408 disposed in a gap in the backscatter layer 416, as well as the annealed active region 426 directly thereunder. The material(s) in the active layers 406, 408 may be selected to produce a multi-layer structure, such as a heterostructure.

In some cases, the backscatter layer 416 is removed in an act 428. Alternatively or additionally, the formation of further active and backscatter layers may be repeated in an act 430. In either case, the resulting structure may thus constitute an intermediate active layer of the electronic apparatus.

The embodiments of FIG. 4 may be applied as described above in connection with the embodiments of FIGS. 1 and 2. For example, the resulting line- or spot-shaped structure(s) shown in FIG. 4 may be useful in connection with ion implantation procedures, electrical activation, thermal diffusion, layer formation (e.g., silicidation, epitaxy, bonding, densification, and deposition), enhanced patterning or etching, and other heat treatment procedures for various purposes, including crystallization, grain growth and defect removal.

Figure 5:
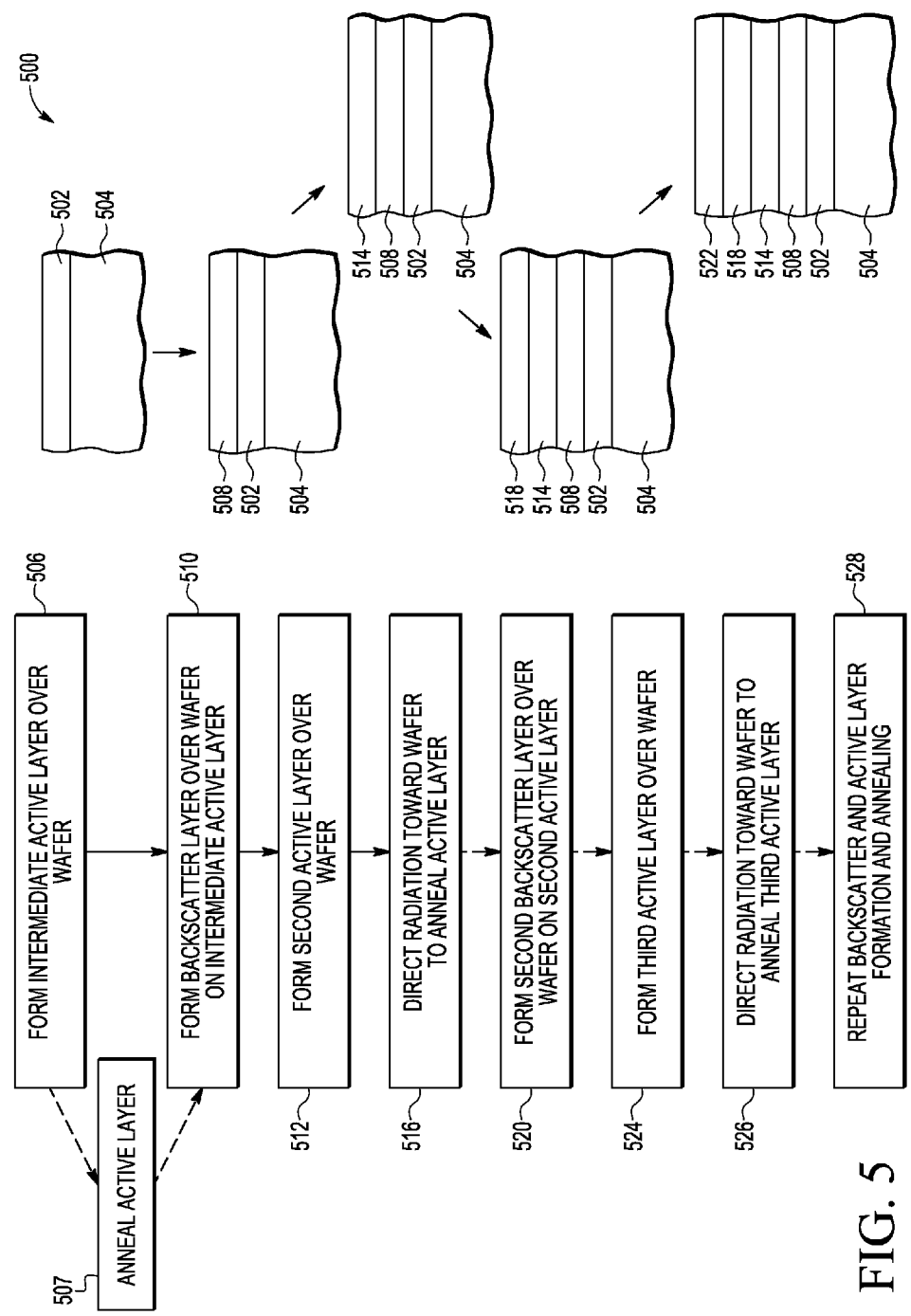
FIG. 5 is a flow diagram of another exemplary method of fabricating an electronic apparatus using multiple backscatter layers for annealing in accordance with one embodiment, together with several partial, cross-sectional, schematic views of the electronic apparatus at various stages in the fabrication sequence.

FIG. 5 depicts a method 500 of fabricating an electronic apparatus in which the annealing of the layers in a multiple layer stack is optimized for each respective layer. The method 500 may begin with the formation of an active layer 502 over a substrate 504 of a wafer in an act 506. The active layer 502 may be formed via deposition and/or patterning of one or more active layer materials as described above. The substrate 504 may be transparent or non-transparent as described above. The active layer 502 may be a first or lowest active layer of the stack and, thus, be considered an intermediate active layer.

In some cases, the active layer 502 is annealed in an act 507. The annealing of the active layer 502 may include directing toward the wafer radiation at a wavelength (or wavelength range) at which the active layer 502 is absorptive. Such annealing may occur after one or more additional acts are implemented, if, for instance, the substrate 504 is transparent at such wavelength(s). The wafer may be reoriented as described above to facilitate such irradiation.

A backscatter layer 508 may be formed over the wafer in an act 510. In this embodiment, the formation of the backscatter layer 508 may include the deposition and patterning of one or more backscatter materials on the active layer 502. In an act 512, a second active layer 514 is formed over the wafer by depositing one or more active layer materials on the backscatter layer 508. Radiation directed toward the wafer in an act 516 may thus anneal the second active layer 514. The backscatter layer 508 is configured and positioned such that the backscatter layer 508 minimizes exposure to the radiation beyond the active layer 514. For example, the position of the backscatter layer 508 helps to avoid any further exposure (i.e., heating) of the active layer 502 and the substrate 504. The active layer 502 is disposed between the backscatter layer 508 and the substrate 504 such that the backscatter layer 508 minimizes an extent to which the radiation reaches the active layer 502.

After the second active layer 514 is annealed, another backscatter layer 518 is deposited on the second active layer 514 in an act 520. A third active layer 522 may then be formed over the wafer by depositing one or more active layer materials on the backscatter layer 518 in an act 524. Further radiation is directed toward the wafer in an act 526 to anneal the third active layer 522. The backscatter layer 518 is configured to minimize an extent to which the further radiation reaches the active layer 514 as well as any intermediate active layer or substrate beneath the active layer 514. The process of forming backscatter and active layers and annealing the active layer may be repeated any number of times in an act 528.

The annealing of each active layer of the embodiment of FIG. 5 may be optimized during the formation of the multiple layer stack. Each active layer may individually annealed in accordance with a respective thermal budget, which may be greater than or less than the thermal budgets of any of the other active layers (including previously formed active layers) and/or the substrate 504. The wavelength of the radiation used to anneal each active layer may differ to optimize the absorption thereof.

The method 500 may include additional acts directed to defining boundaries of, or otherwise patterning, the active and backscatter layers. For example, any of the embodiments involving patterning may be incorporated into one or more layers of the multiple layer stack.

The embodiments of FIG. 5 may be used or incorporated into any one or more of the applications described above. For example, the annealing of any of the active layers may be useful in connection with ion implantation procedures, electrical activation, thermal diffusion, layer formation (e.g., silicidation, epitaxy, bonding, densification, and deposition), enhanced patterning or etching, and other heat treatment procedures for various purposes, including crystallization, grain growth and defect removal.

Figure 6:
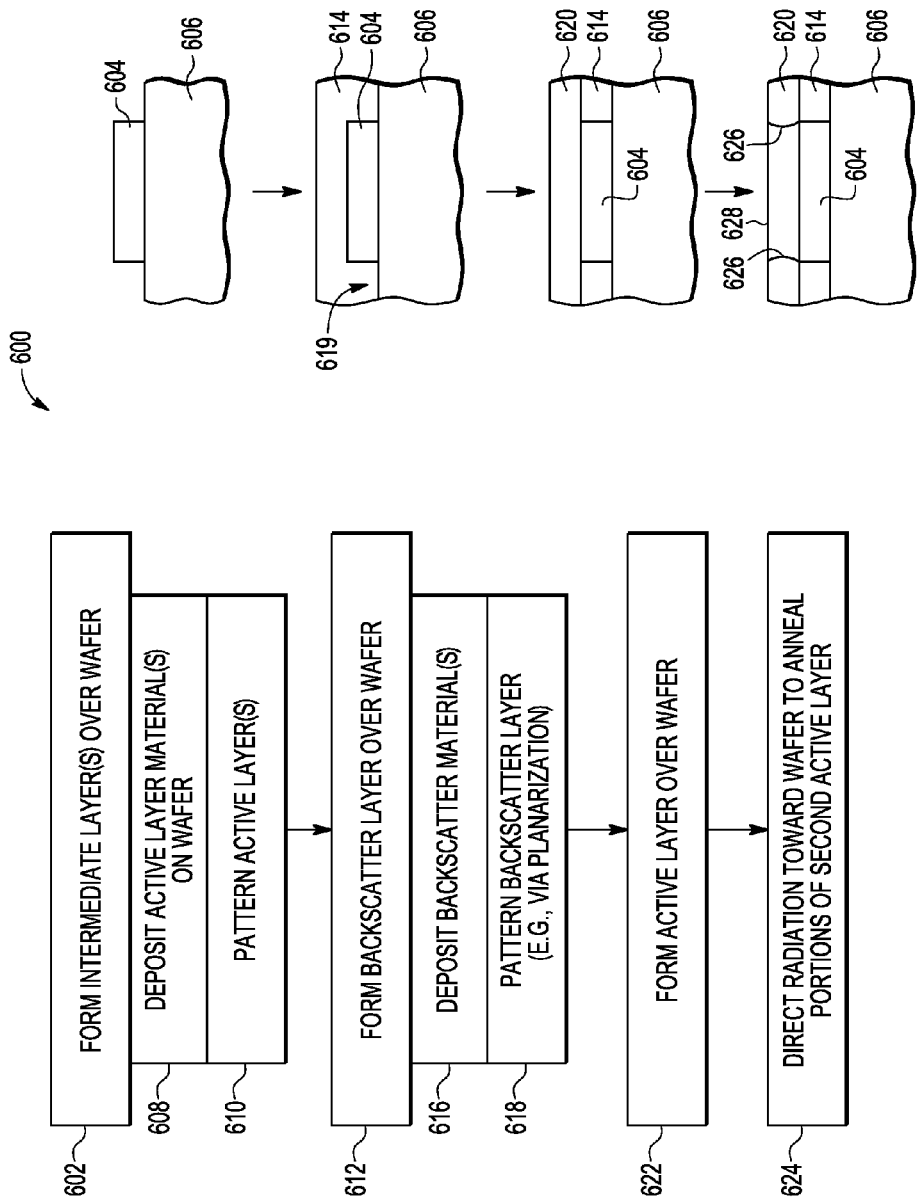
FIG. 6 is a flow diagram of yet an exemplary method of fabricating an electronic apparatus using a buried and patterned backscatter layer for annealing in accordance with one embodiment, together with several partial, cross-sectional, schematic views of the electronic apparatus at various stages in the fabrication sequence.

FIG. 6 depicts a method 600 in which patterning of buried active and backscatter layers leads to a selectively annealed active layer. The method 600 may begin with an act 602 in which an active layer 604 is formed over a substrate 606 of a wafer. The active layer 604 may be referred to as an intermediate or buried active layer. The formation of the active layer 604 may include the deposition of one or more active layer materials in an act 608. In this embodiment, the active layer 604 is patterned in an act 610 to define one or more boundaries thereof. The patterned active layer 604 may have any size or shape. For example, the patterned active layer 604 may have a line, stripe, or spot shape.

In an act 612, a backscatter layer 614 is formed over the wafer. The act 612 may include depositing, in an act 616, one or more backscatter materials of the backscatter layer 614 over and around the active layer 604, and planarizing the wafer to pattern the backscatter layer 614 and to expose the active layer 604. Any chemical etch, mechanical, or chemical-mechanical planarization or removal procedure may be used. The backscatter layer 614 may be patterned into a number of regions or sections surrounding or otherwise disposed alongside the active layer 604.

As with each of the embodiments described herein, the pattern or boundaries of the active layer 604 and/or the backscatter layer 614 may vary from the example shown. For example, the regions of the backscatter layer 614 may be contiguous with one another rather than separated as shown in FIG. 6. In another example, the active layer 604 may be patterned such that an area 619 corresponds with a gap or hole in the active layer 604. In such cases, formation of the backscatter layer 614 may include filling the hole with one or more backscatter materials.

After the planarization, an active layer 620 may then be formed over the wafer in an act 622. In this example, one or more active layer materials of the active layer 620 are deposited on the patterned active layer 604 and the backscatter layer 614. The backscatter layer 614 and the active layer 604 may thus be referred to as buried layers.

In act 624, radiation is directed toward the wafer for selective annealing of the active layer 620. Due to the patterning of the buried backscatter layer 614, only portions 626 of the active layer 620 directly above the backscatter layer 614 may be annealed. While any other portions, such as a portion 628, of the active layer 620 are not annealed. In this embodiment, the portion 628 is disposed over the patterned active layer 604, which may be configured to not backscatter at the wavelength(s) used for annealing.

The device structure of FIG. 6 may be useful in connection with embodiments in which the active layer material(s) of the active layer 620 are low absorbers of the radiation. Such materials may not reach or attain a temperature sufficient for annealing through only a single exposure. The buried nature of the backscatter layer 614 leads to a double exposure of the portions 626.

In some cases, the active layer 604 is also not annealed. For example, the active layer 604 may not reach a temperature sufficient for annealing due to partial absorption of the radiation in the section 628 of the active layer 620. Alternatively, the active layer 604 may include one or more strong absorbers of the radiation, in which case the active layer 604 may be annealed despite some energy losses to the active layer 620.

The embodiments described above in connection with FIG. 6 may be utilized in one or more of the above-referenced applications.

In a first aspect, a method of fabricating an electronic apparatus includes forming an active layer over a wafer, forming a backscatter layer over the wafer, and directing radiation toward the wafer to anneal the active layer. The backscatter layer is not transparent to the radiation, more reflective than absorptive of the radiation, and positioned such that the backscatter layer inhibits exposure of the wafer to the radiation apart from the active layer.

The method may further include forming an intermediate active layer on a substrate of the wafer and directing further radiation toward the wafer to anneal the intermediate active layer. Forming the backscatter layer may include depositing a backscatter layer material of the backscatter layer on the intermediate active layer after directing the further radiation to anneal the intermediate active layer. Forming the active layer may include depositing an active layer material of the active layer on the backscatter layer. The method may then further include depositing a further backscatter layer on the active layer, depositing an active material of the third active layer on the further backscatter layer, and directing further radiation toward the wafer to anneal the third active layer. The further backscatter layer may be configured to minimize an extent to which the further radiation reaches the active layer.

The method may further include forming an intermediate active layer on a substrate of the wafer. Forming the backscatter layer may include depositing a backscatter material of the backscatter layer on the intermediate active layer after forming the intermediate active layer, and directing further radiation through a transparent substrate of the wafer to anneal the intermediate active layer. Forming the active layer may include depositing an active layer material of the active layer on the backscatter layer after directing the further radiation to anneal the intermediate active layer. The method may then further include depositing a backscatter material of a further backscatter layer on the active layer, depositing an active material of a third active layer on the further backscatter layer, and directing still further radiation toward the wafer to anneal the third active layer. The further backscatter layer may be configured to minimize an extent to which the further radiation reaches the active layer.

The method may further include forming an intermediate active layer on a substrate of the wafer. Forming the backscatter layer may include depositing a backscatter material of the backscatter layer on the intermediate active layer, the backscatter layer being configured to minimize an extent to which the intermediate active layer is exposed to the radiation. Forming the active layer may include depositing an active layer material of the active layer on the backscatter layer. The method may then further include depositing a further backscatter material of a further backscatter layer on the active layer, depositing a further active layer material of a third active layer on the further backscatter layer, and directing still further radiation toward the wafer to anneal the third active layer. The further backscatter layer may be configured to minimize an extent to which the further radiation reaches the active layer.

Forming the backscatter layer may include patterning the backscatter layer to define a first area of the active layer exposed to the radiation and a second area of the active layer not exposed to the radiation. The method may then include removing the patterned backscatter layer.

The method may further include depositing an intermediate active layer on a substrate of the wafer. Forming the active layer may include depositing an active material of the active layer on the intermediate active layer and patterning the active layer. Forming the backscatter layer may include depositing a backscatter material of the backscatter layer over and around the patterned active layer and planarizing the wafer to pattern the backscatter layer and to expose the patterned intermediate active layer. The patterned active layer and a first portion of the intermediate active layer adjacent the patterned active layer are then annealed by the radiation, and a second portion of the intermediate active layer is not annealed by the radiation.

The method may further include depositing an intermediate active layer on a substrate of the wafer and patterning the intermediate active layer to define a hole. Forming the backscatter layer may include filling the hole with backscatter material. Forming the active layer may include depositing the active layer on the patterned intermediate active layer and the backscatter material in the hole. A first portion of the active layer over the backscatter material is then annealed, and a second portion of the active layer not over the backscatter material is not annealed.

The radiation may include microwave radiation. The backscatter layer is then configured to backscatter the microwave radiation. The active layer is then configured to absorb the microwave radiation.

In a second aspect, an electronic apparatus includes a substrate, a backscatter layer supported by the substrate, and an active layer disposed over the backscatter layer, the active layer having an annealed configuration in accordance with a first thermal budget higher than a second thermal budget of the substrate. The active layer includes a material absorptive of electromagnetic energy at a predetermined frequency at which the backscatter layer backscatters the electromagnetic energy.

The backscatter layer may include a conductive material neither absorptive of, nor transparent to, microwave radiation. Alternatively or additionally, the active layer includes a dielectric layer. Alternatively or additionally, the active layer includes an organic layer.

In a third aspect, an electronic apparatus includes a substrate, a backscatter layer supported by the substrate, and an active layer disposed adjacent the backscatter layer. The active layer includes an annealed section and a non-annealed section. The annealed and non-annealed sections have a layout that corresponds with a pattern of the backscatter layer.

The active layer may be disposed between the backscatter layer and the substrate such that the non-annealed section is covered by the backscatter layer. The electronic apparatus may then further include an annealed active region disposed in a gap in the backscatter layer.

The backscatter layer may be disposed between the active layer and the substrate such that the annealed section is disposed above and adjacent to the backscatter layer. The electronic apparatus may then further include a non-annealed active region disposed in a gap in the backscatter layer. Alternatively or additionally, the electronic apparatus further includes a non-annealed active region surrounding the backscatter layer.

The backscatter layer may include a thermal insulator material disposed between the active layer and the substrate. Alternatively or additionally, the backscatter layer includes a conductive material neither absorptive of, nor transparent to, microwave radiation.

The active layer may include a semiconductor material, the semiconductor material including electrically activated dopant. Alternatively or additionally, the active layer includes a silicide layer. Alternatively or additionally, the active layer includes a first constituent layer and a second constituent layer bonded to the first constituent layer. Alternatively or additionally, the active layer includes a dielectric layer.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. An electronic apparatus comprising:
   a substrate;
   a backscatter layer supported by the substrate;
   an active layer disposed over the backscatter layer, the active layer having an annealed configuration in accordance with a first thermal budget higher than a second thermal budget of the substrate;
   wherein the active layer comprises a material absorptive of electromagnetic energy at a predetermined frequency at which the backscatter layer backscatters the electromagnetic energy, and
   wherein the annealed configuration comprises an annealed section of the active layer and a non-annealed section of the active layer, the annealed and non-annealed sections having a layout defined by a pattern of the backscatter layer.

2. The electronic apparatus of claim 1, wherein the backscatter layer comprises a thermal insulator material disposed between the active layer and the substrate.

3. The electronic apparatus of claim 1, wherein the active layer comprises a semiconductor material, the semiconductor material comprising electrically activated dopant.

4. The electronic apparatus of claim 1, wherein the active layer comprises a silicide layer.

5. The electronic apparatus of claim 1, wherein the active layer comprises a first constituent layer and a second constituent layer bonded to the first constituent layer.

6. The electronic apparatus of claim 1, wherein the active layer is selectively annealed.

7. An electronic apparatus comprising:
   a substrate;
   a backscatter layer supported by the substrate; and
   an active layer disposed adjacent the backscatter layer;
   wherein the active layer comprises an annealed section and a non-annealed section, the annealed and non-annealed sections having a layout that corresponds with a pattern of the backscatter layer.

8. The electronic apparatus of claim 7, wherein the active layer is disposed between the backscatter layer and the substrate such that the non-annealed section is covered by the backscatter layer.

9. The electronic apparatus of claim 7, wherein the backscatter layer is disposed between the active layer and the substrate such that the annealed section is disposed above and adjacent to the backscatter layer.

10. The electronic apparatus of claim 7, further comprising a buried active layer disposed between the non-annealed section and the substrate.

11. The electronic apparatus of claim 10, wherein the buried active layer is patterned to define a boundary, and wherein the backscatter layer is disposed adjacent the boundary of the buried active layer.

12. The electronic apparatus of claim 10, wherein the backscatter layer is disposed in a hole in the buried active layer.

13. The electronic apparatus of claim 10, wherein the buried active layer is configured to not backscatter light at wavelengths backscattered by the backscatter layer.

14. The electronic apparatus of claim 10, wherein the buried active layer is not annealed.

15. The electronic apparatus of claim 7, wherein the backscatter layer comprises a thermal insulator layer and a layer of a conductive material.

16. The electronic apparatus of claim 7, wherein the active layer comprises an organic material.

17. An electronic apparatus comprising:
a substrate;
a backscatter layer supported by the substrate;
an active layer disposed over the backscatter layer, the active layer having an annealed configuration in accordance with a first thermal budget higher than a second thermal budget of the substrate; and
a buried active layer disposed between a non-annealed section of the active layer and the substrate, wherein the buried active layer has a lower thermal budget than the first thermal budget of the active layer;
wherein the active layer comprises a material absorptive of electromagnetic energy at a predetermined frequency at which the backscatter layer backscatters the electromagnetic energy.

* * * * *